(12) United States Patent
Fukuda et al.

(10) Patent No.: US 9,831,890 B2
(45) Date of Patent: Nov. 28, 2017

(54) SEMICONDUCTOR DEVICE, POWER SUPPLY DEVICE AND CONTROL METHOD FOR SEMICONDUCTOR DEVICE

(71) Applicant: Renesas Electronics Corporation, Tokyo (JP)

(72) Inventors: Keisuke Fukuda, Tokyo (JP); Mamoru Kitamura, Tokyo (JP); Motoaki Suzuki, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/354,974

(22) Filed: Nov. 17, 2016

(65) Prior Publication Data

US 2017/0163278 A1 Jun. 8, 2017

(30) Foreign Application Priority Data

Dec. 7, 2015 (JP) ................... 2015-238415

(51) Int. Cl.
*H03M 1/34* (2006.01)
*H03M 1/46* (2006.01)
*H02M 3/08* (2006.01)
*H02M 7/04* (2006.01)

(52) U.S. Cl.
CPC .............. *H03M 1/46* (2013.01); *H02M 3/08* (2013.01); *H02M 7/04* (2013.01)

(58) Field of Classification Search
CPC ............. H03M 1/45; H02M 3/08; H02M 7/04
USPC .................................. 341/150–165
See application file for complete search history.

(56) References Cited

U.S. PATENT DOCUMENTS

| 5,629,700 A * | 5/1997 | Kumamoto | H03M 1/002 341/155 |
| 2002/0075004 A1* | 6/2002 | Yudahira | G01R 31/3658 324/434 |
| 2009/0122834 A1* | 5/2009 | Wang | G01K 7/21 374/185 |
| 2011/0057658 A1* | 3/2011 | Yugou | B60L 7/10 324/426 |
| 2014/0049234 A1* | 2/2014 | Park | G05F 1/575 323/265 |
| 2015/0115925 A1* | 4/2015 | Teh | H03M 1/068 323/283 |
| 2015/0153605 A1* | 6/2015 | Chang | G02F 1/13306 349/33 |

FOREIGN PATENT DOCUMENTS

JP H 06-334523 A 12/1994

* cited by examiner

*Primary Examiner* — Lam T Mai
(74) *Attorney, Agent, or Firm* — McGinn IP Law Group, PLLC

(57) ABSTRACT

A semiconductor device configured to perform an A/D conversion of a wide range of signals is provided. A semiconductor device includes: an input voltage detection unit configured to detect an analog input voltage; a reference voltage setting unit configured to set a reference voltage based on the detected input voltage; an amplifier configured to amplify a difference between the input voltage and the reference voltage; an ADC configured to perform an A/D conversion of an amplified signal; and an arithmetic processing unit configured to calculate a digital voltage corresponding to the input voltage based on a result of the A/D conversion and the reference voltage.

13 Claims, 12 Drawing Sheets

DETECTED CURRENT
(DETECTED VOLTAGE)

DETECTED CURRENT
(DETECTED VOLTAGE)

SEMICONDUCTOR DEVICE, POWER SUPPLY DEVICE AND CONTROL METHOD FOR SEMICONDUCTOR DEVICE

CROSS-REFERENCE TO RELATED APPLICATIONS

This application is based upon and claims the benefit of priority from Japanese patent application No. 2015-238415, filed on Dec. 7, 2015, the disclosure of which is incorporated herein in its entirety by reference.

BACKGROUND

The present invention relates to a semiconductor device, a power supply device, and a control method for a semiconductor device. For example, the present invention relates to a semiconductor device including an A/D converter, a power supply device, and a control method for a semiconductor device.

An A/D converter (ADC) that converts an analog signal into a digital signal is widely used in various devices and systems. For example, in a power supply device that generates a desired output voltage, an ADC converts a detected signal according to an output voltage into a digital signal, and a feedback control is performed so that the output voltage becomes a constant voltage on the basis of the digital signal.

There is a demand for an ADC that converts a wide range of signals to cope with variety of applications such as the above-mentioned power supply device. As a related art, for example, Japanese Unexamined Patent Application Publication No. H06-334523 is known.

SUMMARY

For example, when an amplifier is connected to a pre-stage of the ADC to perform an A/D conversion of an analog signal of a small level, there is a possibility that the range of the analog signal to be subjected to the A/D conversion may be limited. Accordingly, a problem to be solved in one embodiment is to perform an A/D conversion of a wide range of signals.

Other problems to be solved by and novel features of the present invention will be apparent from the following description and the accompanying drawings.

According to one embodiment, a semiconductor device includes an input voltage detection unit, a reference voltage setting unit, a difference amplifier, an A/D converter, and an arithmetic processing unit. The input voltage detection unit detects an analog input voltage. The reference voltage setting unit sets a reference voltage based on the detected input voltage. The difference amplifier amplifies a difference between the input voltage and the reference voltage. The A/D converter performs an A/D conversion of an amplified signal. The arithmetic processing unit calculates a digital voltage corresponding to the input voltage based on a result of the A/D conversion and the reference voltage.

According to the one embodiment, an A/D conversion can be performed on a wide range of signals.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
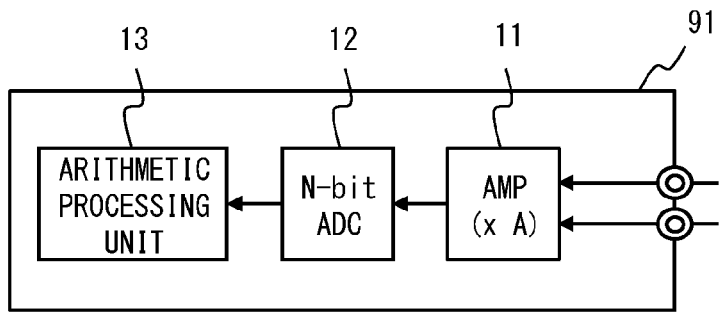
FIG. 1 is a block diagram showing a configuration example of a semiconductor device of Study Example 1.

The following description and the drawings are abbreviated and simplified as appropriate to clarify the explanation. Elements illustrated in the drawings as functional blocks for performing various processes can be implemented hardwarewise by a CPU, a memory, and other circuits, and can be implemented softwarewise by a program or the like loaded into a memory. Accordingly, it is understood by those skilled in the art that the functional blocks can be achieved in various forms including hardware alone, software alone, and combinations thereof, and are not limited to any of them. Note that the same elements are denoted by the same reference numerals throughout the drawings, and repeated descriptions are omitted as necessary.

(First Embodiment)

A first embodiment will be described below with reference to the drawings. To facilitate understanding of the first embodiment, semiconductor devices of Study Examples 1 and 2 will be described first and then a semiconductor device according to the first embodiment will be described.

<Semiconductor Devices of Study Examples 1 and 2>

Figure 2:
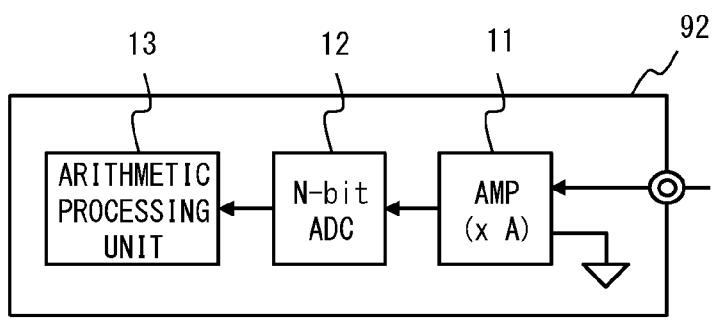
FIG. 2 is a block diagram showing a configuration example of a semiconductor device of Study Example 2.

FIG. 1 shows a configuration example of a semiconductor device 91 of Study Example 1. FIG. 2 shows a configuration example of a semiconductor device 92 of Study Example 2. As shown in FIGS. 1 and 2, the semiconductor device 91 of Study Example 1 includes an amplifier (AMP) 11, an N-bit ADC 12, and an arithmetic processing unit 13. Similarly, the semiconductor device 92 of Study Example 2 includes the amplifier 11, the ADC 12, and the arithmetic processing unit 13.

The amplifier 11 is an amplifier that amplifies an input signal with a predetermined amplification factor (gain). The amplifier 11 is, for example, an operational amplifier, and is a difference amplifier that amplifies a difference between an input voltage and an amplifier reference voltage. The ADC 12 performs an A/D conversion of an analog signal amplified by the amplifier 11 into an N-bit digital signal. The arithmetic processing unit 13 performs necessary arithmetic processing on a result of the A/D conversion of the ADC 12.

The ADC 12 is, for example, a successive approximation register (SAR) type ADC with a high resolution. The SAR type ADC can convert a small signal with a high resolution, while it is difficult for the SAR type ADC to achieve a high-speed operation, because successive approximation processing is repeatedly performed. Accordingly, in order to perform a high-speed operation using the SAR type ADC, it is necessary to employ a low-bit (low-resolution) ADC.

However, it is difficult for a low-bit ADC to accurately convert (detect) a small input signal (voltage). Accordingly, in the semiconductor device 91 of Study Example 1 and the semiconductor device 92 of Study Example 2, the amplifier 11 is connected to a pre-stage of the ADC 12. To deal with a small signal, in the semiconductor device 91 of Study Example 1, a difference voltage between two terminals, i.e., an inverting input terminal Vin (−) and a non-inverting input terminal Vin (+), of the amplifier 11 is amplified A times, and in the semiconductor device 92 of Study Example 2, the inverting input terminal Vin (−) of the amplifier 11 is connected to GND and the voltage between the non-inverting input terminal Vin (+) and GND (voltage between Vin (+) and GND) is amplified A times. For example, the voltage input to the non-inverting input terminal Vin (+) is referred to as an input voltage (or a detected voltage), and the voltage input to the inverting input terminal Vin (−) is referred to as an amplifier reference voltage (or simply as a reference voltage).

Figure 3:
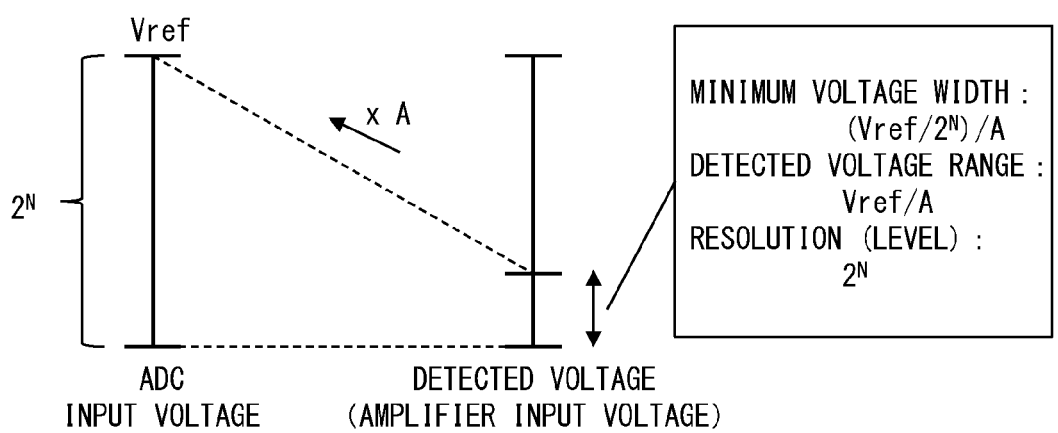
FIG. 3 is a graph showing a resolution and an input range of AD/conversion in Study Examples 1 and 2.

FIG. 3 shows a resolution and an input range A/D conversion in Study Examples 1 and 2. As shown in FIG. 3, assuming that the reference voltage (maximum input voltage) of the ADC 12 is represented by Vref; the resolution (conversion bit) of the ADC 12 is represented by N bits ($2^N$); and the amplification factor of the amplifier 11 is represented by A, the range of detectable (convertible) voltages is expressed as Vref/A and a minimum detectable voltage width is expressed as (Vref/$2^N$)/A. Thus, a voltage of 1/A which is smaller than when the amplifier 11 is not provided can be detected.

At this time, assuming that the A/D conversion result is represented by data D, a detected digital voltage Vd obtained by converting the detected voltage can be obtained by the following (Formula 1).

$$Vd = (D/2^N) \times (Vref/A) \quad \text{(Formula 1)}$$

Note that the ADC 12 may output the value of (Formula 1), or the arithmetic processing unit 13 may calculate (Formula 1).

In this manner, for example, when a high-resolution SAR type ADC is used, the operation speed decreases. On the other hand, in order to achieve a high-speed operation using the SAR type ADC, the resolution is lowered. Accordingly, it is necessary to provide an amplifier at a pre-stage of the ADC. In Study Examples 1 and 2, when the amplifier having the amplification factor A is used, the detected voltage range which can be subjected to A/D conversion is represented by Vref/A, and this range becomes narrower in proportion to the amplification factor A. Note that the resolution of the detected voltage range Vref/A which can be subjected to A/D conversion is represented by $2^N$ levels in an N-bit ADC. This resolution does not change regardless of the amplification factor A and whether an amplifier is present or not. Further, as disclosed in Japanese Unexamined Patent Application Publication No. H06-334523, there is a possibility that the processing speed may be lowered when the amplifier reference voltage is controlled based on a result of the A/D conversion. Accordingly, in the first embodiment, the resolution is improved by increasing the detected voltage range of the A/D conversion, and a higher-speed operation can be achieved.

<Semiconductor Device of First Embodiment>

Figure 4:
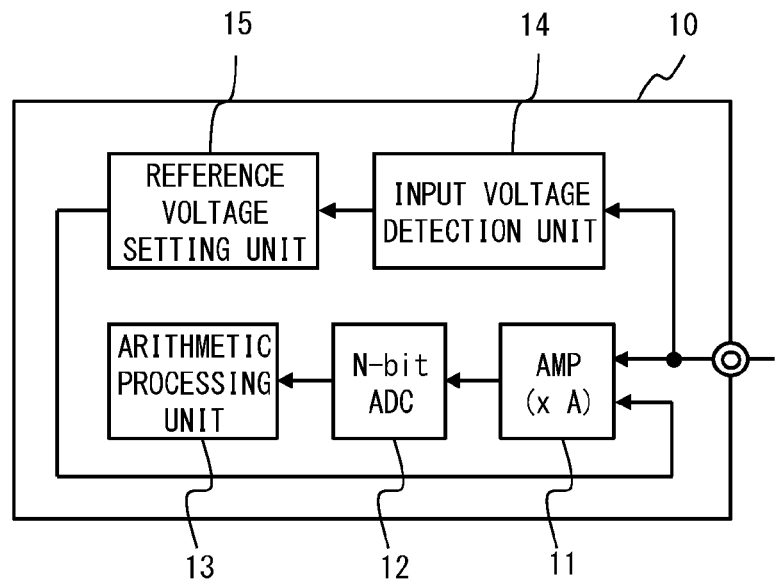
FIG. 4 is a block diagram showing a configuration example of a semiconductor device according to a first embodiment.

FIG. 4 shows a configuration example of a semiconductor device 10 according to the first embodiment. As shown in FIG. 4, the semiconductor device 10 according to the first embodiment includes not only the amplifier 11, the ADC 12, and the arithmetic processing unit 13, but also an input voltage detection unit 14 and a reference voltage setting unit 15.

The input voltage detection unit 14 detects an analog input voltage, and the reference voltage setting unit 15 sets an amplifier reference voltage based on the detected input voltage. The amplifier (difference amplifier) 11 amplifies a difference between the input voltage and the amplifier reference voltage, and the ADC (A/D converter) 12 performs an A/D conversion of the amplified signal. The arithmetic processing unit 13 calculates a digital voltage corresponding to the input voltage based on a result of the A/D conversion and the amplifier reference voltage.

Figure 5:
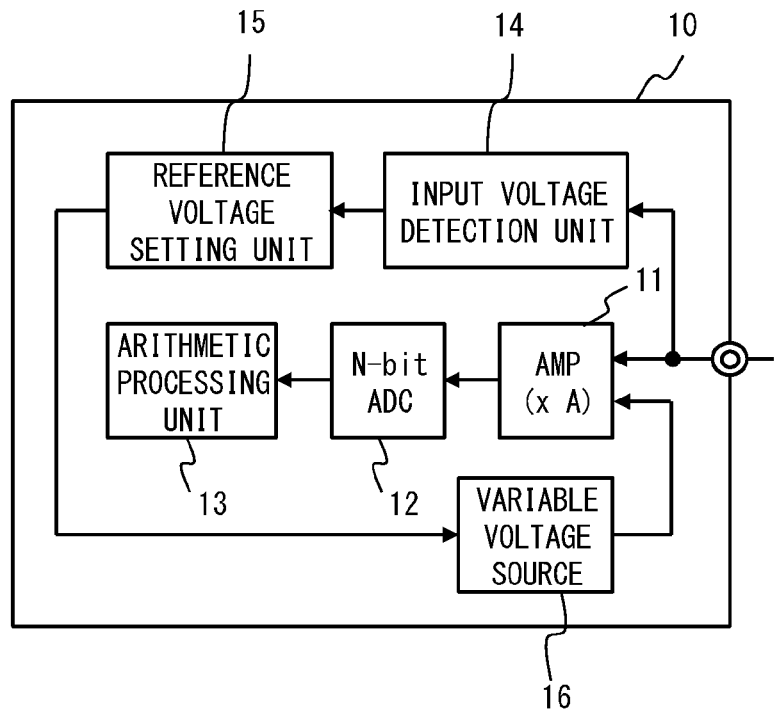
FIG. 5 is a block diagram showing a configuration example of the semiconductor device according to the first embodiment.
Figure 6:
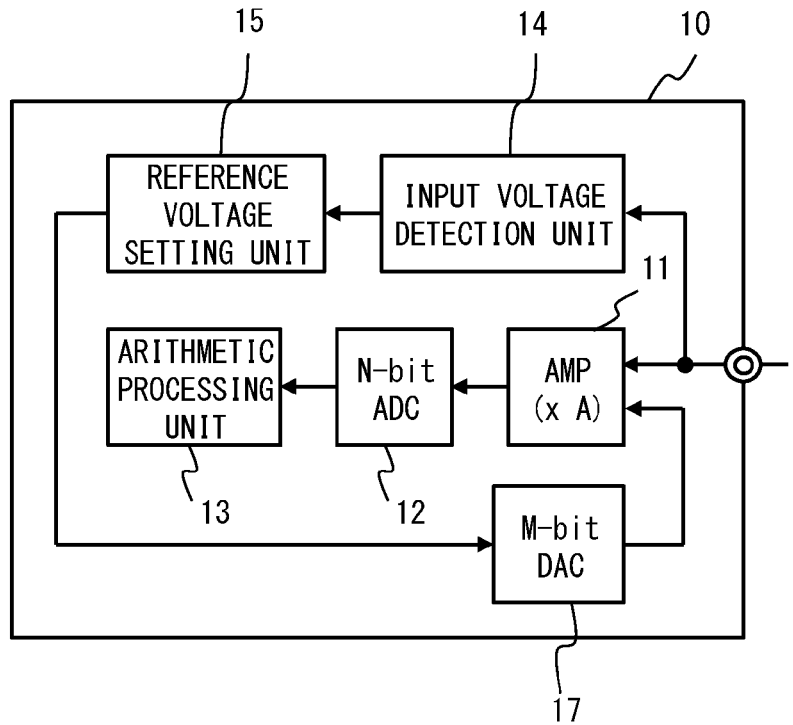
FIG. 6 is a block diagram showing a configuration example of the semiconductor device according to the first embodiment.

As shown in FIG. 4, the reference voltage setting unit 15 may directly set the amplifier reference voltage to be supplied to the amplifier 11, or a variable voltage source 16 that supplies the amplifier reference voltage to the amplifier 11 may be provided as shown in FIG. 5 so that the reference voltage setting unit 15 controls the voltage of the variable voltage source 16. As shown in FIG. 6, the variable voltage source may be composed of an M-bit DAC (D/A converter) 17.

In the first embodiment, as shown in FIG. 4, the amplifier (operational amplifier) 11 is connected to a pre-stage of the ADC 12; a detected voltage is supplied to the non-inverting input terminal Vin (+) of the amplifier 11; and a variable voltage (amplifier reference voltage) is supplied to the inverting input terminal Vin (−). With this configuration, the input range and the resolution as shown in FIG. 7 are obtained in the first embodiment.

Figure 7:
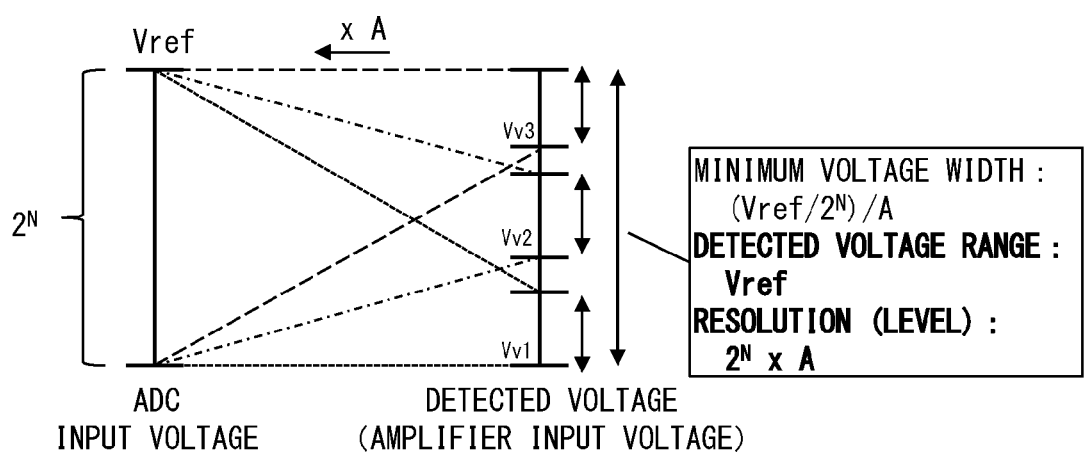
FIG. 7 is a graph showing an input range of A/D conversion in the first embodiment.

Like in FIG. 3, in FIG. 7, the reference voltage (maximum input voltage) of the ADC 12 is represented by Vref; the resolution (conversion bit) of the ADC 12 is represented by N bits ($2^N$); and the amplification factor of the amplifier 11 is represented by A. In the first embodiment, the amplifier reference voltage is changed (Vv1 to Vv3) according to the detected voltage, and the difference voltage between the detected voltage and the amplifier reference voltage is Vref÷A or less. When the amplifier reference voltage is made variable, the range of detectable (convertible) voltages is represented by Vref; a minimum detectable voltage width is represented by (Vref/$2^N$)/A; and a resolution is represented by $2^N$*A. Accordingly, in the first embodiment, the detected voltage range and the resolution can be improved by A-fold as compared with Study Examples 1 and 2.

At this time, assuming that the data of the A/D conversion result is represented by D and the amplifier reference voltage (variable voltage) at that time is represented by Vv, the detected digital voltage Vd obtained by converting the detected voltage can be obtained by the following (Formula 2).

$$Vd=(D/2^N) \times (Vref/A)+Vv \qquad \text{(Formula 2)}$$

Note that the ADC 12 may output the value of (Formula 2), or the arithmetic processing unit 13 may calculate (Formula 2). For example, the ADC 12 may output (D/$2^N$)×(Vref/A) and the arithmetic processing unit 13 may add Vv.

Thus, in the first embodiment, the detected voltage range which can be subjected to A/D conversion can be increased to the entire range of Vref, regardless of the amplification factor A of the operational amplifier. In the case of an N-bit ADC, the resolution of the detected voltage range (Vref) which can be subjected to A/D conversion is increased to A×$2^N$ levels according to the amplification factor A of the amplifier. For example, when a 10-bit ADC and an operational amplifier having an amplification factor of 32 are used, a resolution of 32×$2^{10}$ levels is obtained.

The determination of the variable voltage using the input voltage detection unit (for example, a comparator) achieves a high-speed operation as compared with an example in which the A/D conversion result is read and the amplifier reference voltage is determined.

For example, the first embodiment can be used for power supply applications, illumination applications, and sensor applications. When the first embodiment is used for sensor applications and a detected signal of a sensor is subjected to an A/D conversion, a smaller voltage and a sensor output with a more dynamic range can be detected.

Note that in the configuration shown in FIG. 4, a plurality of amplifiers (operational amplifiers) may be connected. A much smaller voltage can be detected with high resolution according to the number of operational amplifiers and amplification factors. For example, when operational amplifiers having amplification factors B and C, respectively, are additionally provided, a resolution of $2^N$×A×B×C levels is obtained, so that the minimum detectable voltage is represented by (Vref/$2^N$)/(A×B×C).

(Second Embodiment)

A second embodiment will be described below with reference to the drawings. The second embodiment is an example in which the first embodiment is applied to a power supply device for LED. To facilitate understanding of the second embodiment, a power supply device of Study Example 3 will be described first and then a power supply device according to the second embodiment will be described.

<Power Supply Device of Study Example 3>

Figure 8:
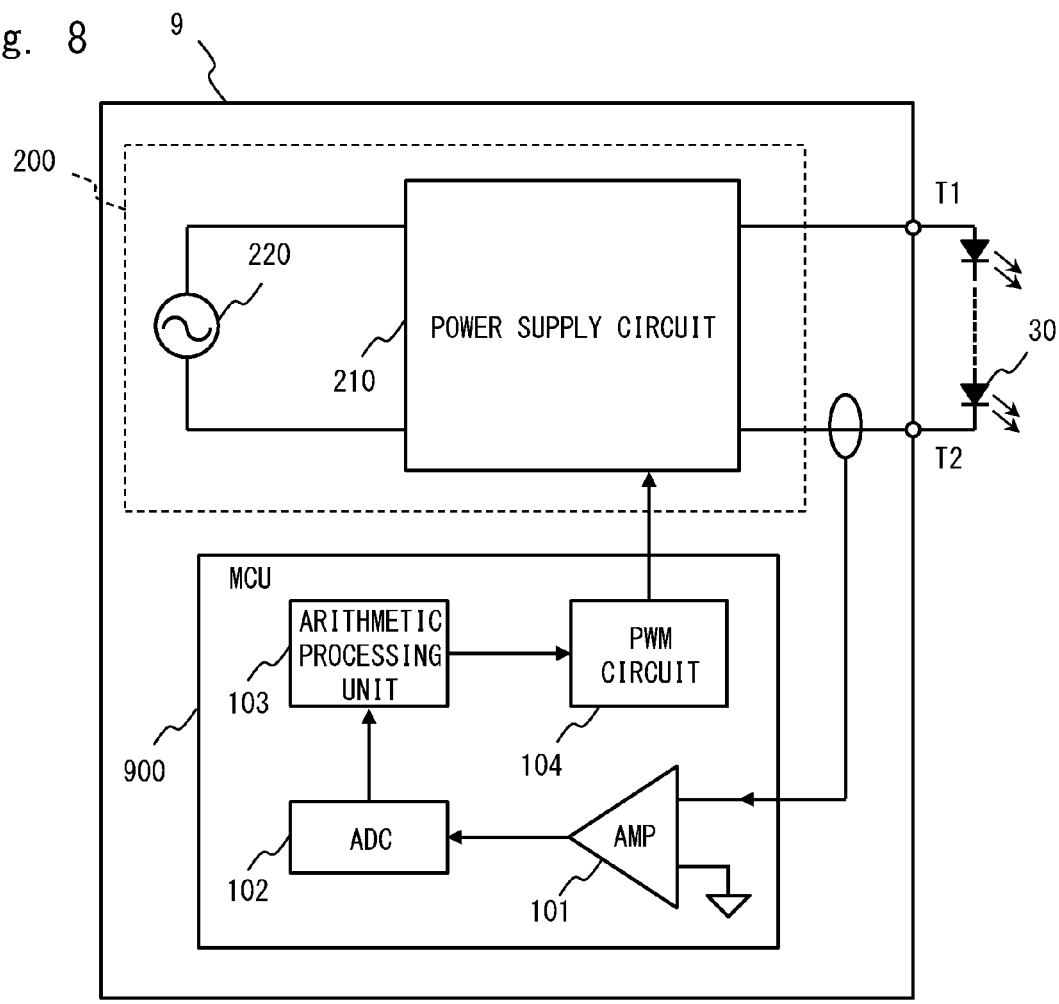
FIG. 8 is a block diagram showing a configuration example of a power supply device of Study Example 3.

FIG. 8 shows a configuration example of the power supply device of Study Example 3. As shown in FIG. 8, a power supply device 9 of Study Example 3 includes a power supply unit 200 and an MCU 900. Further, a plurality of LEDs 30 are connected between terminals T1 and T2 as loads of the power supply unit 200.

The power supply unit 200 is a power supply unit that supplies power generated based on the control from the MCU 900 to the LEDs 30 (loads). For example, the power supply unit 200 generates a DC power supply of a desired voltage from AC power (or DC power).

In the example shown in FIG. 8, the power supply unit 200 includes a power supply circuit 210 and an AC power supply 220. The power supply circuit 210 is supplied with the AC power supply 220, converts the AC power supply to the DC power supply based on a control signal (PWM signal) from the MCU 900, and supplies the DC power supply to the LEDs 30.

The MCU (microcontroller) 900 is a semiconductor device that controls the operation of the power supply unit 200 according to a current or voltage of each of the LEDs 30 so that a desired power is supplied to the LEDs 30 (loads). The MCU 900 includes an amplifier 101, an ADC 102, an arithmetic processing unit 103, and a PWM circuit 104.

The amplifier 101 is, for example, an operational amplifier, and amplifies the current or voltage of the LEDs 30 with the set amplification factor (gain). ADC 102 is, for example, an SAR type ADC, and performs an A/D conversion of the signal amplified by the amplifier 101. The arithmetic processing unit 103 performs necessary arithmetic processing on the AD/conversion result of the ADC 102, and generates a PWM control signal for controlling the power supply circuit 210 so that the current of each of the LEDs 30 becomes a desired value. The PWM circuit (a PWM signal generation circuit, or a control signal generation circuit) 104 generates a PWM signal according to the PWM control signal from the arithmetic processing unit 103, and supplies the generated PWM signal to the power supply circuit 210. The pulse width, period, and duty ratio of the PWM signal are controlled according to the PWM control signal, and the power supply circuit 210 performs a switching operation according to the PWM signal, thereby controlling the output power.

Figure 9:
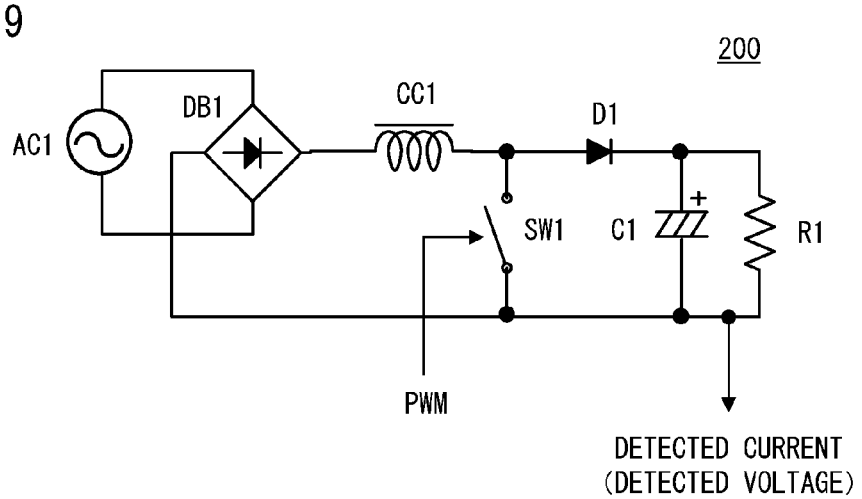
FIG. 9 is a circuit diagram showing a configuration example of a power supply unit of Study Example 3.
Figure 10:
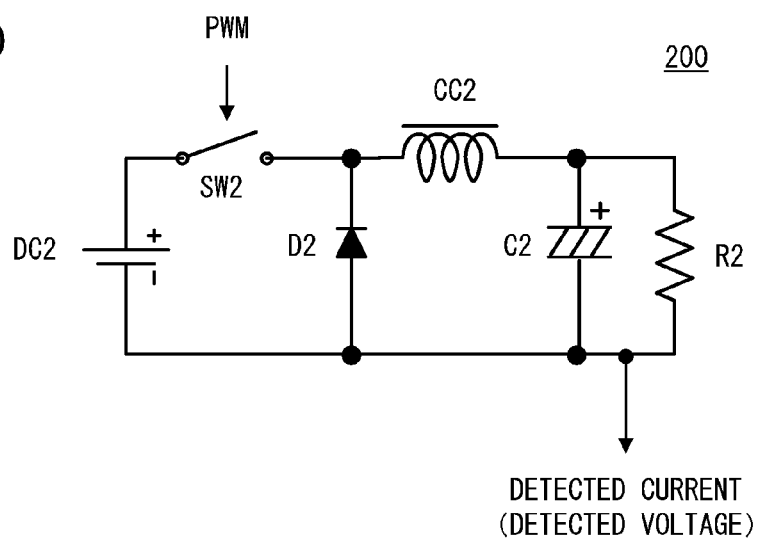
FIG. 10 is a circuit diagram showing a configuration example of the power supply unit of Study Example 3.
Figure 11:
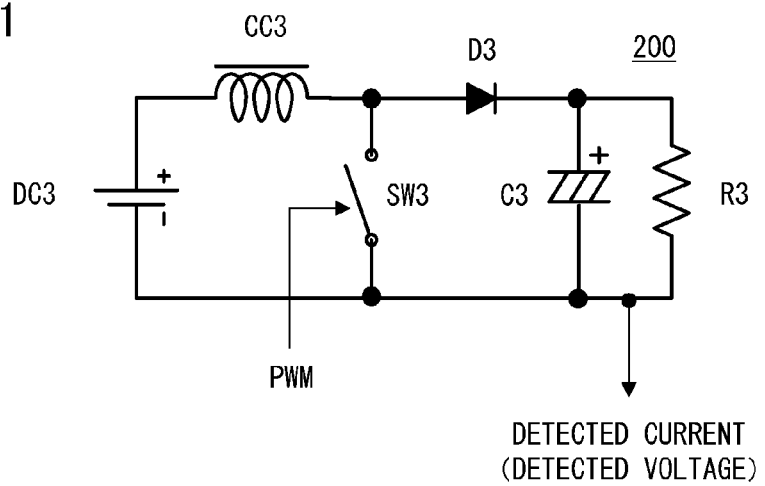
FIG. 11 is a circuit diagram showing a configuration example of the power supply unit of Study Example 3.

FIGS. 9 to 11 show specific circuit configuration examples of the power supply unit 200.

FIG. 9 shows an example in which the power supply unit 200 is implemented by a power factor correction (PFC) circuit. In the example of FIG. 9, the power supply unit 200 includes an AC power supply AC1, a diode bridge DB1, a choke coil CC1, a switch SW1, a diode D1, and a capacitor C1, and is connected to a resistor R1 as a load. The diode bridge DB1, the choke coil CC1, the switch SW1, the diode D1, and the capacitor C1 correspond to the power supply circuit 210.

The AC power supply AC1 is connected to a node between one input terminal of the diode bridge DB1 and the other input terminal of thereof. The switch SW1 is connected to a node between one output terminal of the diode bridge DB1 and the other output terminal thereof through the choke coil CC1. The capacitor C1 and the resistor R1 are connected in parallel to both ends of the switch SW1 through the diode D1.

The AC power supply AC1 is rectified by the diode bridge DB1, and the rectified power is converted into a direct current according to the inductor of the choke coil CC1. The converted direct current is smoothed by the capacitor C1 through the diode D1 and is supplied to the resistor R1 as DC power. The switch SW1 is supplied with the PWM signal from the PWM circuit 104, and is turned on/off according to the PWM signal. By turning on/off the switch SW1 according to the PWM signal, the current flowing through the diode D1, the capacitor C1, and the resistor R1 is switched to control the output voltage. One end of the resistor R1 is connected to the amplifier 101 (for example, connected through a shunt resistor), and the current (detected current) flowing through the resistor R1 is input to the amplifier 101.

FIG. 10 shows an example in which the power supply unit 200 is implemented by a step-down DC/DC converter. In the example of FIG. 10, the power supply unit 200 includes a DC power supply DC2, a switch SW2, a diode D2, a choke coil CC2, and a capacitor C2, and is connected to a resistor R2 as a load. The switch SW2, the diode D2, the choke coil CC2, and the capacitor C2 correspond to the power supply circuit 210.

The diode D2 is connected to both ends of the DC power supply DC2 through the switch SW2. The capacitor C2 and the resistor R2 are connected in parallel to both ends of the diode D2 through the choke coil CC2.

The DC power supply DC2 is applied and converted into a direct current according to the inductor of the choke coil CC2. The converted direct current is smoothed by the capacitor C2 and is supplied to the resistor R2 as DC power. The switch SW2 is supplied with the PWM signal from the PWM circuit 104, and is turned on/off according to the PWM signal. By turning on/off the switch SW2 according to the PWM signal, the current flowing through the choke coil CC2, the capacitor C2, the resistor R2, and the diode D2 is switched to control the output voltage. One end of the resistor R2 is connected to the amplifier 101 and the current (detected current) flowing through the resistor R2 is input to the amplifier 101.

FIG. 11 shows an example in which the power supply unit 200 is implemented by a step-up DC/DC converter. In the example of FIG. 11, the power supply unit 200 includes a DC power supply DC3, a choke coil CC3, a switch SW3, a diode D3, and a capacitor C3, and is connected to a resistor R3 as a load. The choke coil CC3, the switch SW3, the diode D3, and the capacitor C3 correspond to the power supply circuit 210.

The switch SW3 is connected to both ends of the DC power supply DC3 through the choke coil CC3. The capacitor C3 and the resistor R3 are connected in parallel to both ends of the switch SW3 through the diode D3.

The DC power supply DC3 is applied and converted into a direct current according to the inductor of the choke coil CC3. The converted direct current is smoothed by the capacitor C3 through the diode D3 and is supplied to the resistor R3 as DC power. The switch SW3 is supplied with the PWM signal from the PWM circuit 104, and is turned on/off according to the PWM signal. By turning on/off the switch SW3 according to the PWM signal, the current flowing through the diode D3, the capacitor C3, and the resistor R3 is switched to control the output voltage. One end of the resistor R3 is connected to the amplifier 101, and the current (detected current) flowing through the resistor R3 is input to the amplifier 101.

Figure 12:
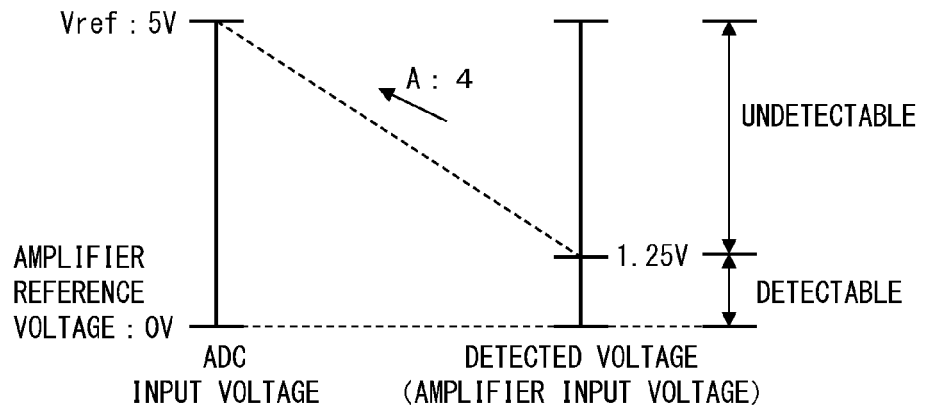
FIG. 12 is a graph showing an input range of A/D conversion in Study Example 3.

FIG. 12 shows the input range of A/D conversion in Study Example 3. In the example of FIG. 12, the reference voltage (maximum input voltage) Vref of the ADC 102 is 5 V and the amplification factor (gain) of the amplifier 101 is 4. Like in FIG. 3, the range of the detectable (convertible) voltage is represented by Vref/A, 5/4=1.25 V holds. Accordingly, in Study Example 3, only a voltage range from 0 V to 1.25 V can be detected, while a voltage of 1.25 V or more cannot be detected. Note that, for example, when another circuit for detecting a voltage of 1.25 V or more is additionally provided, this may result in an increase of the chip area of the semiconductor device.

<Power Supply Device of Second Embodiment>

Figure 13:
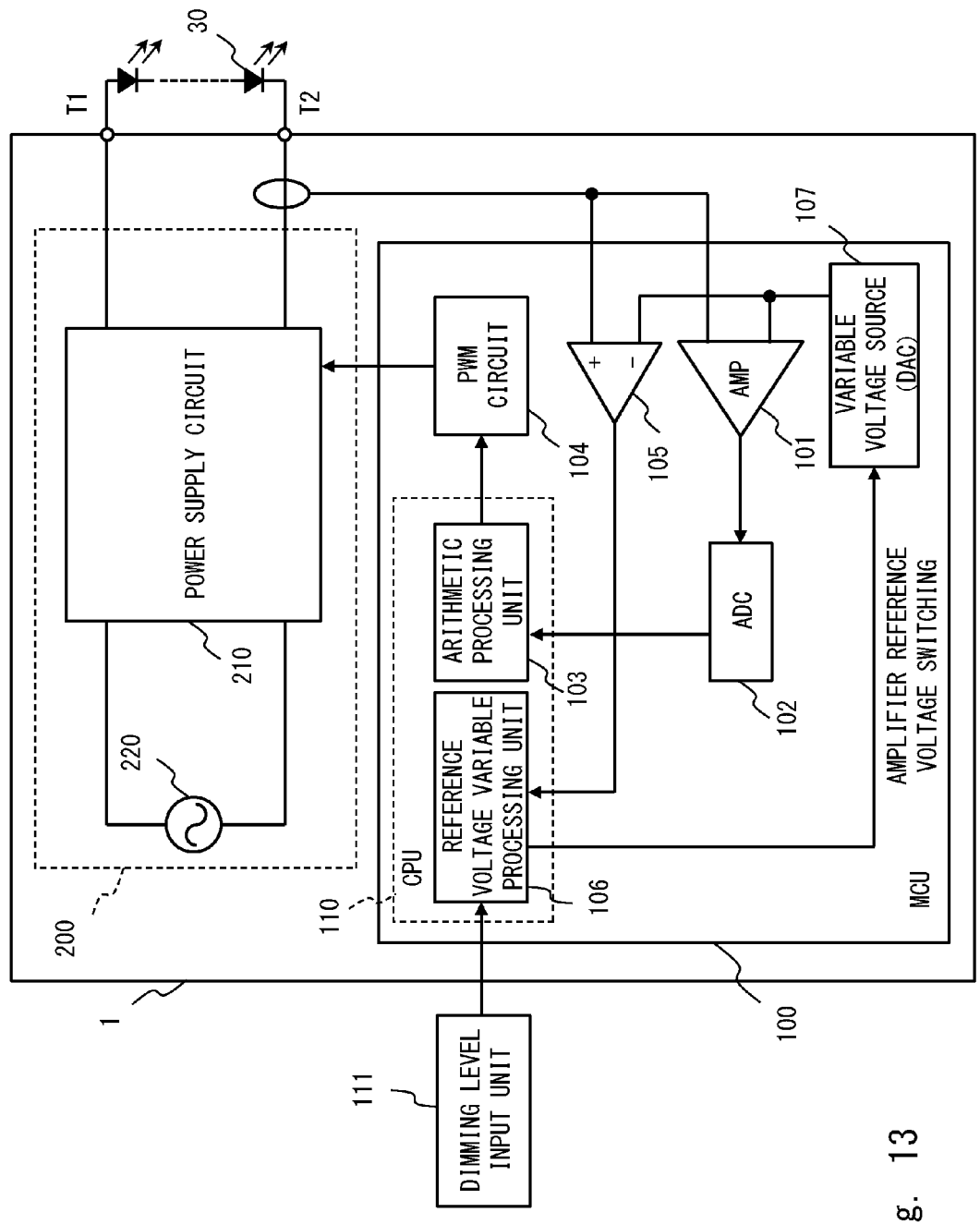
FIG. 13 is a block diagram showing a configuration example of a power supply device according to a second embodiment.

FIG. 13 shows a configuration example of a power supply device according to the second embodiment. As shown in FIG. 13, a power supply device 1 according to the second embodiment includes the power supply unit 200 and an MCU 100. The power supply unit 200 is connected to the LEDs 30 as loads, like in Study Example 3 shown in FIG. 8.

The MCU 100 according to the second embodiment includes not only the amplifier 101, the ADC 102, the arithmetic processing unit 103, and the PWM circuit 104, which are also provided in Study Example 3 shown in FIG. 8, but also a comparator 105, a reference voltage variable processing unit 106, and a variable voltage source 107.

The variable voltage source 107 generates the variable voltage (reference voltage) Vv according to the control from the reference voltage variable processing unit 106. The generated variable voltage Vv is supplied to the amplifier 101 as the amplifier reference voltage, and the variable voltage Vv is also supplied to the comparator 105 as the comparator reference voltage. For example, the variable voltage source 107 is a D/A converter incorporated in the MCU. In the case of the D/A converter, an amplifier reference voltage switch signal from the reference voltage variable processing unit 106 is subjected to D/A conversion and the variable voltage Vv is generated. The reference voltage can be automatically set only by the circuit incorporated in the MCU by using the D/A converter.

Figure 14:
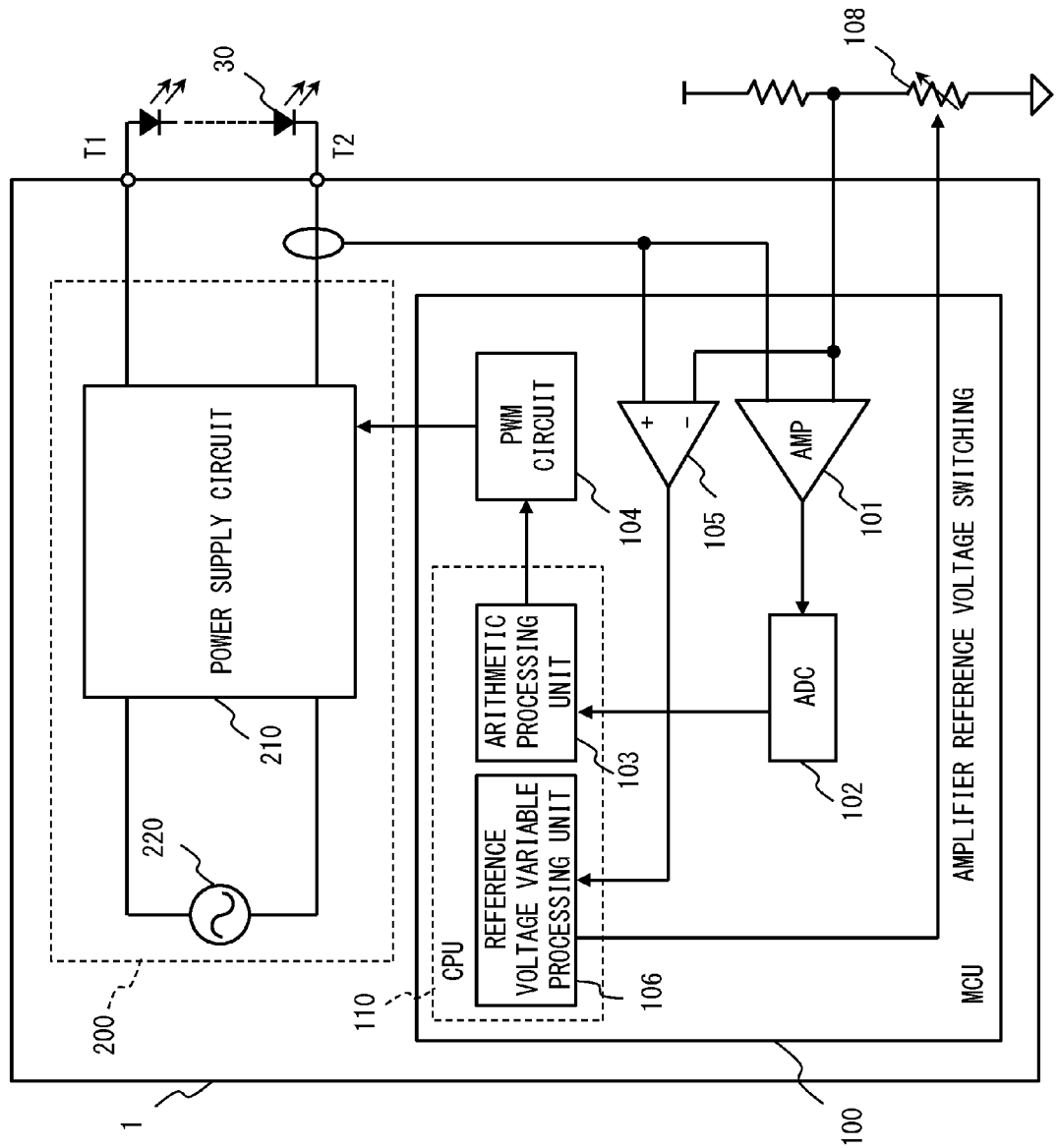
FIG. 14 is a block diagram showing a configuration example of the power supply device according to the second embodiment.

The variable voltage source 107 is not necessarily provided in the MCU, but may be an external circuit. FIG. 14 shows an example in which an external variable resistor 108 is used as the variable voltage source. For example, the variable resistor 108 can be composed of a ladder resistor or the like connected between the power supply and GND. The variable resistor 108 makes the resistance value variable according to the amplifier reference voltage switch signal from the reference voltage variable processing unit 106, and generates the variable voltage Vv using the resistance value. The reference voltage can be arbitrarily set according to the control from the MCU, or according to an external control, by using an external circuit.

The non-inverting input terminal Vin (+) of the comparator 105 receives the detected voltage according to an LED current, and the inverting input terminal Vin (−) of the comparator 105 receives the comparator reference voltage (threshold voltage). The comparator 105 compares the detected voltage with the comparator reference voltage, and outputs the comparison result to the reference voltage variable processing unit 106. In this case, since the comparator reference voltage is the variable voltage Vv of the variable voltage source 107, the comparator 105 compares the detected voltage with the variable voltage Vv. The comparator detects the detected voltage (input voltage), thereby making it possible to detect the voltage easily and rapidly.

The reference voltage variable processing unit 106 controls the variable voltage Vv of the variable voltage source according to the comparison result of the comparator 105. The reference voltage variable processing unit 106 sets the reference voltage (comparator reference voltage and amplifier reference voltage) according to the level of the detected voltage. The reference voltage variable processing unit 106 sets the amplifier reference voltage when the comparator detects the detected voltage (when the detected voltage exceeds the comparator reference voltage) to the amplifier reference voltage. The reference voltage can be set rapidly by setting the reference voltage based on the detection result of the comparator. The arithmetic processing unit 103 and the reference voltage variable processing unit 106 constitute a CPU 110. The CPU 110 executes programs for various processes, thereby implementing the arithmetic processing unit 103 and the reference voltage variable processing unit 106. The reference voltage variable processing unit 106 receives, from the dimming level input unit 111, the dimming level according to a user's operation. The reference voltage variable processing unit 106 may set the reference voltage according to the dimming level. In the second embodiment, in order to variably set the amplifier reference voltage, the arithmetic processing unit 103 adds the reference voltage to the A/D conversion result of the ADC 102. Thus, the detected voltage can be precisely converted into a digital value.

Figure 15:
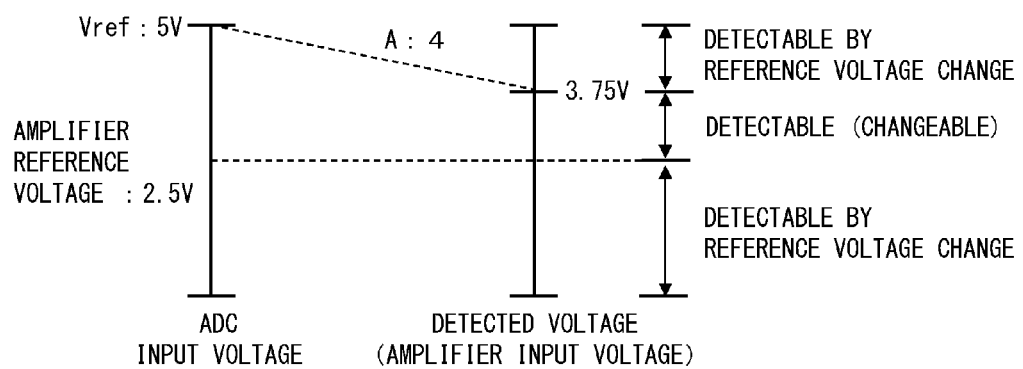
FIG. 15 is a graph showing an input range of A/D conversion in the second embodiment.

FIG. 15 shows the input range of A/D conversion in the second embodiment. In the example of FIG. 15, the reference voltage (maximum input voltage) Vref of the ADC 102 is 5 V and the amplification factor (gain) of the amplifier 101 is 4. For example, when the amplifier reference voltage is set to 2.5V, the detectable voltage ranges from 2.5 V to 3.75 V. Further, a voltage of 0 V to 5 V can be detected by changing the amplifier reference voltage. In other words, the power supply device can control the supply of power of 0 V to 5 V.

<Operation of Second Embodiment>

Figure 16:
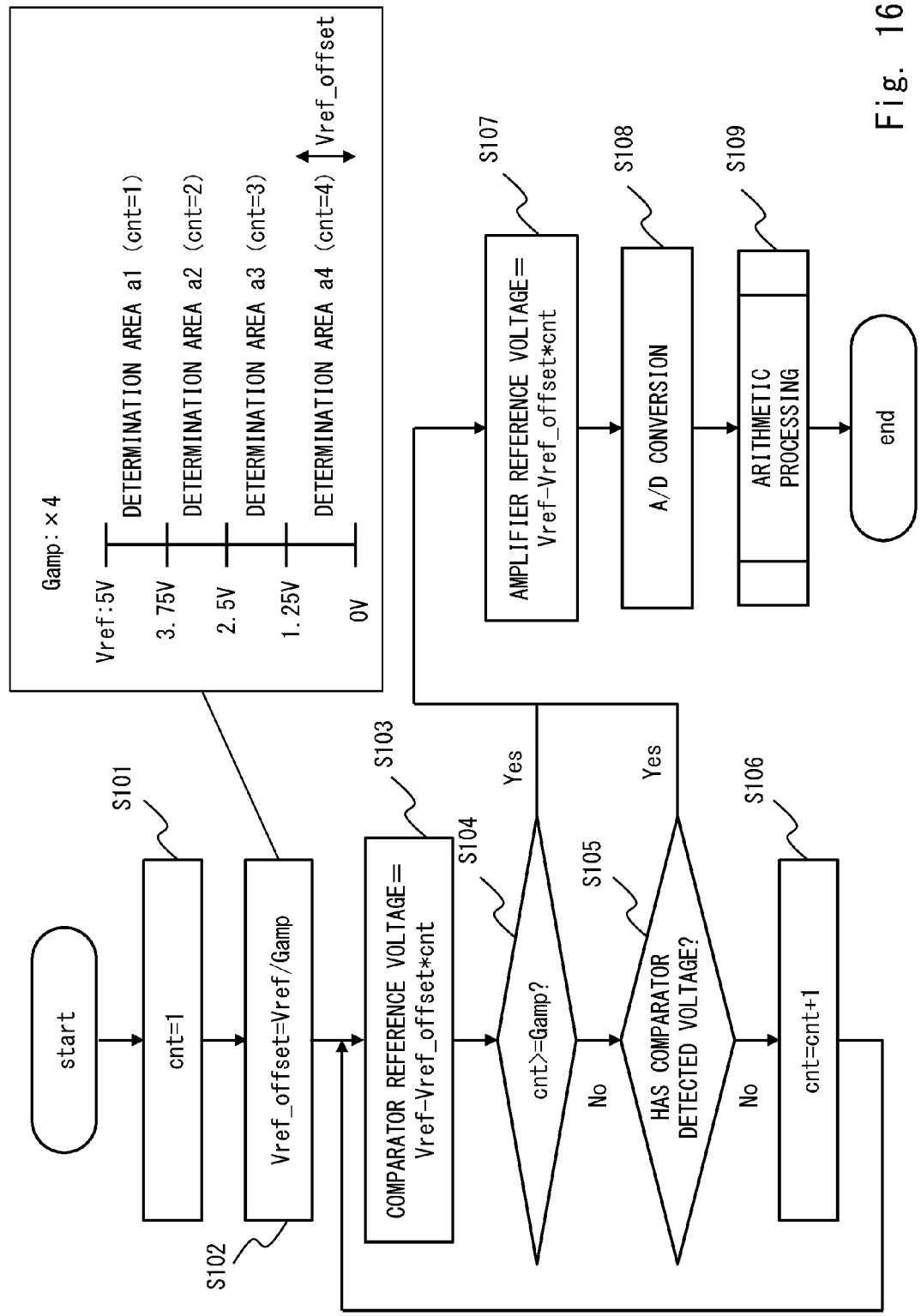
FIG. 16 is a flowchart showing an operation example of a semiconductor device according to the second embodiment.

FIG. 16 is a flowchart showing an example of the A/D conversion operation of the second embodiment. In this example, since the reference voltage Vref of the ADC 102 is 5 V and a gain Gamp of the amplifier 101 is 4, 5 V is divided into quarters and determinations areas a1 to a4 each having 1.25 V (Vref_offset) are obtained. The determination area is a divided area obtained by dividing the input range of the ADC by the gain of the amplifier. A counter cnt (count value) used in the flowchart indicates the determination area, and an optimum reference voltage corresponding to the determination area is obtained. In this example, the determination areas (a1 to a4) are sequentially selected, and the reference voltage is set based on the area corresponding to the detected voltage (input voltage). Thus, the optimum reference voltage can be easily set.

As shown in FIG. 16, first, the reference voltage variable processing unit 106 initializes the determination area for determining the detected voltage (S101), and determines the voltage determination range Vref_offset (S102). Specifically, the counter cnt is set to 1 (cnt=1) and the voltage determination range (temporal reference voltage) Vref_offset is set to Vref/Gamp (Vref_offset=Vref/Gamp). In this example, Vref_offset=5/4=1.25 V holds.

Subsequently, the reference voltage variable processing unit 106 sets the voltage of a first determination area (voltage determination range) to the reference voltage (threshold) of the comparator 105 (S103). Specifically, the comparator reference voltage is set to Vref−Vref_offset*cnt. For example, in a first operation, since cnt indicates 1 (cnt=1) (determination area a1), the comparator reference voltage is 5−1.25*1=3.75 V.

Subsequently, the reference voltage variable processing unit 106 determines whether the counter cnt is equal to or more than the amplifier gain Gamp (S104). When the counter cnt is smaller than the amplifier gain Gamp, the detection result of the comparator 105 is determined (S105).

When the counter cnt is equal to or more than the amplifier gain Gamp, or when the comparator reference voltage is lower than the detected voltage and the comparator 105 responds (detects a voltage), the reference voltage variable processing unit 106 sets the current comparator reference voltage to the reference voltage of the amplifier 101 (S107). Specifically, the amplifier reference voltage is set to Vref−Vref_offset*cnt. For example, in the first operation, since cnt indicates 1 (cnt=1), the amplifier reference voltage is set to 5−1.25*1=3.75. Note that in the second embodiment, the variable voltage source 107 supplies the same reference voltage to the comparator 105 and the amplifier 101, and thus the setting process in S107 may be omitted.

In the state where the reference voltage of the amplifier is set, the ADC 102 executes the A/D conversion (S108), and the arithmetic processing unit 103 performs arithmetic processing on the A/D conversion result (S109). Specifically, like in the first embodiment, $(D/2^N) \times (Vref/A) + Vv$ is obtained.

In S105, when the comparator 105 does not respond (detect a voltage) at the current reference voltage, the reference voltage variable processing unit 106 adds 1 (increments) the counter cnt (S106), and repeats step S103 and subsequent steps. Specifically, the subsequent determination area is selected (a2 is selected after a1), thereby resetting the comparator reference voltage and sequentially changing the comparator reference voltage until the comparator 105 responds. When the comparator 105 does not respond in all determination areas, the counter cnt is equal to the amplifier gain Gamp in S104, and the minimum reference voltage (0 V) is set to the amplifier reference voltage to execute the A/D conversion.

Figure 17:
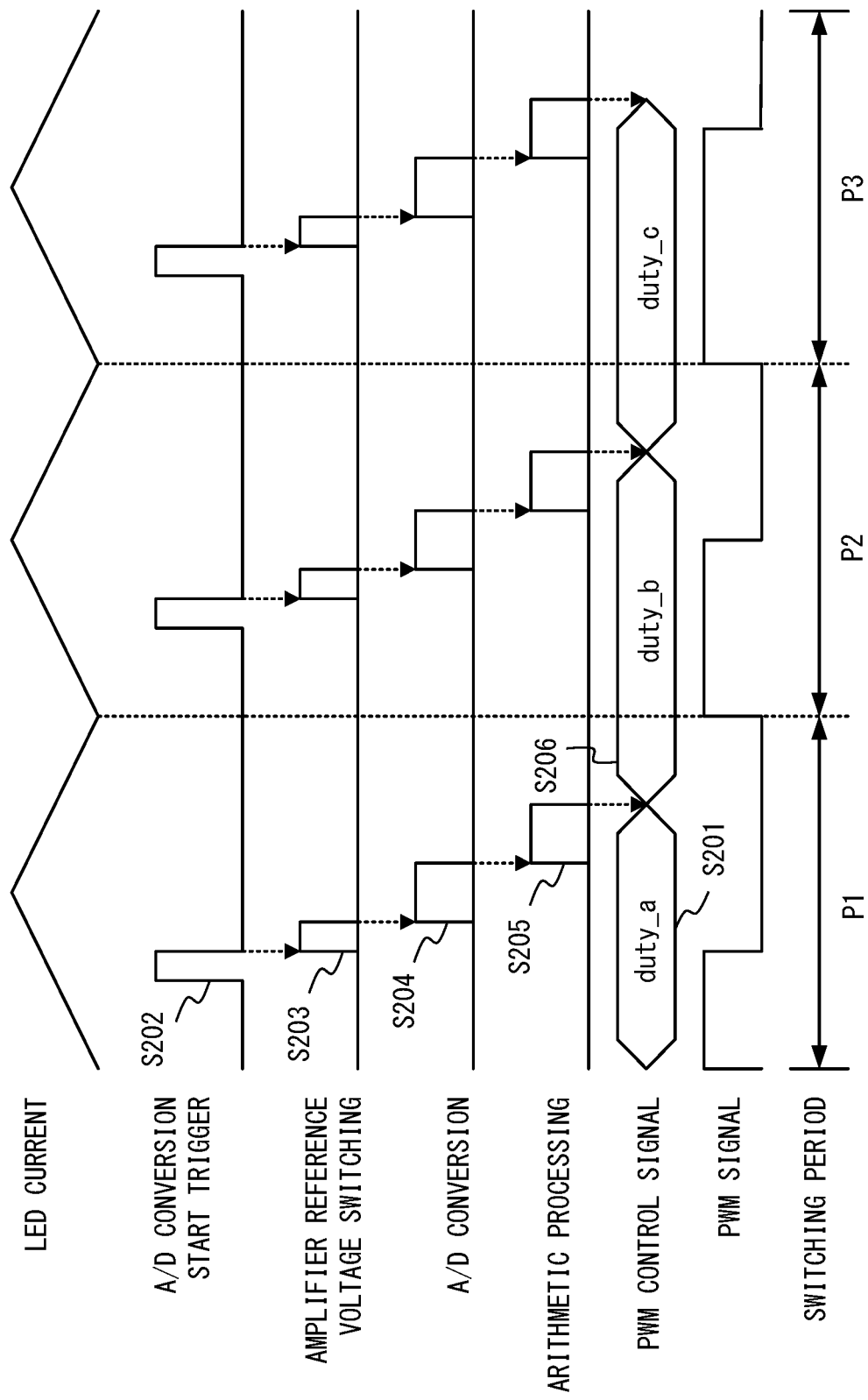
FIG. 17 is a timing diagram showing an operation example of the power supply device according to the second embodiment.

FIG. 17 is a timing diagram showing an example of the LED dimming operation of the second embodiment. As shown in FIG. 17, the PWM signal is generated in each switching cycle of the power supply circuit, and the current corresponding to the pulse width of the PWM signal flows through the LEDs.

First, in a period P1, the PWM control signal having a duty ratio "a" is output from the arithmetic processing unit 103 to the PWM circuit 104 (S201), and the PWM circuit 104 outputs the PWM signal having the duty ratio "a" to the power supply circuit 210. The current corresponding to the PWM signal from the power supply circuit 210 flows through the LEDs 30.

In the reference voltage variable processing unit 106, an A/D conversion start trigger is generated at predetermined intervals (S202). According to the A/D conversion start trigger, the reference voltage variable processing unit 106 performs amplifier reference voltage switch processing (S203). In other words, the reference voltage variable processing unit 106 sets the amplifier reference voltage according to the detected voltage (LED current) as described above with reference to the flowchart of FIG. 16.

When the amplifier reference voltage is switched, the ADC 102 performs an A/D conversion (S204), and the arithmetic processing unit 103 performs arithmetic processing on the A/D conversion result (S205). The arithmetic processing unit 103 outputs, to the PWM circuit 104, the PWM control signal having a duty ratio "b" according to the operation result. Then, in a period P2, the PWM circuit 104 outputs the PWM signal having the duty ratio "b" to the power supply circuit 210. Also in a period P3, the PWM signal having a duty ratio "c" is generated.

As described above, in the second embodiment, the first embodiment is applied to the power supply device that performs dimming of LEDs, thereby making it possible to perform constant voltage/constant current control (15-bit resolution etc.) with higher precision, not in a specific small voltage, but in a wider range of voltage/current. When the second embodiment is used for illumination applications, a wider range of dimming levels (100% to 0.001% etc.) can be achieved in a finer dimming step (0.001% step etc.). Further, the number of bits of the ADC can be reduced, which contributes to a reduction in operation time for power supply control (speed-up of feedback control). Furthermore, the voltage determination areas are sequentially selected and the amplifier reference voltage is set according to the detection result of the comparator, so that the reference voltage can be set easily and rapidly.

(Third Embodiment)

A third embodiment will be described with reference to the drawings. The third embodiment illustrates an operation in which the dimming level is switched in the configuration of the second embodiment. Note that the description of parts the same as those of the second embodiment is omitted.

Figure 18:
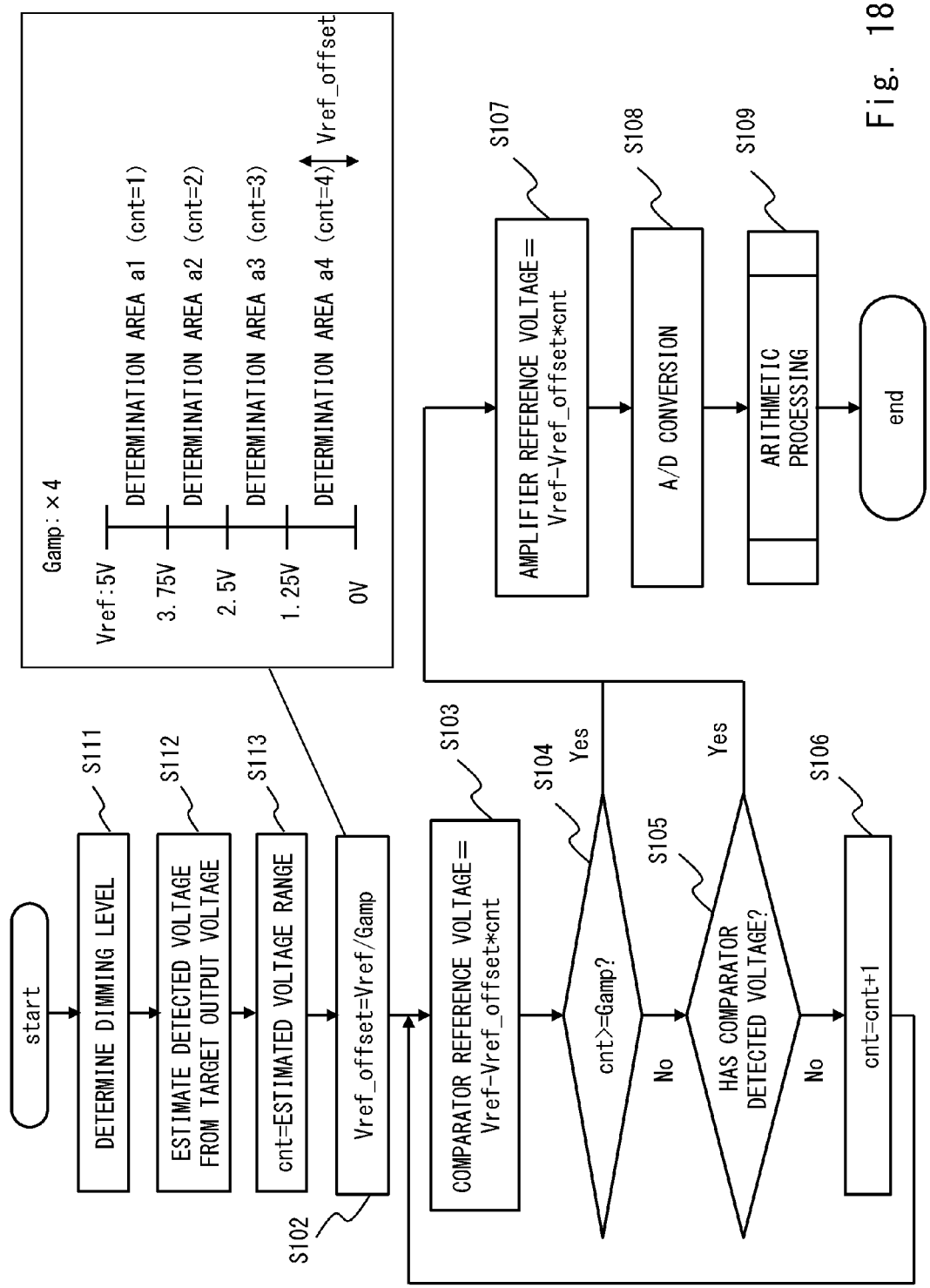
FIG. 18 is a flowchart showing an operation example of a semiconductor device according to a third embodiment.

FIG. 18 is a flowchart showing an example of the A/D conversion operation of the third embodiment. As shown in FIG. 18, the reference voltage variable processing unit 106 determines the dimming level according to the input from the dimming level input unit 111 as a user interface (S111).

Next, the reference voltage variable processing unit 106 estimates the detected voltage from the target output current (S112). Specifically, the current (target output current) detected at the current dimming level is calculated from the dimming level and the maximum LED current, and this current is converted into a voltage value to be detected. For example, as a method for calculating the detected voltage estimated from the dimming level, the detected voltage can be obtained from the dimming level, the maximum output current value, and the shunt resistance value for current detection, as shown in the following (Formula 3).

$$\text{Estimated detected voltage} = \text{dimming level [\%]} \times \text{maximum output current value } [A] \times \text{shunt resistance value } [\Omega] \quad \text{(Formula 3)}$$

Next, the reference voltage variable processing unit 106 divides the detected voltage range by the gain of the amplifier 101, and designates the determination area that matches the estimated detected voltage obtained from the dimming level (S113). Specifically, the counter cnt is set and the determination area is designated. For example, when the estimated voltage level is 3 V, the determination area a2 (detected voltage range) is selected.

Subsequently, like in the first embodiment, the amplifier reference voltage is set and the A/D conversion is performed (S102 to S109). In the third embodiment, the determination area is selected based on the dimming level, which eliminates the need for sequentially selecting all determination areas.

Figure 19:
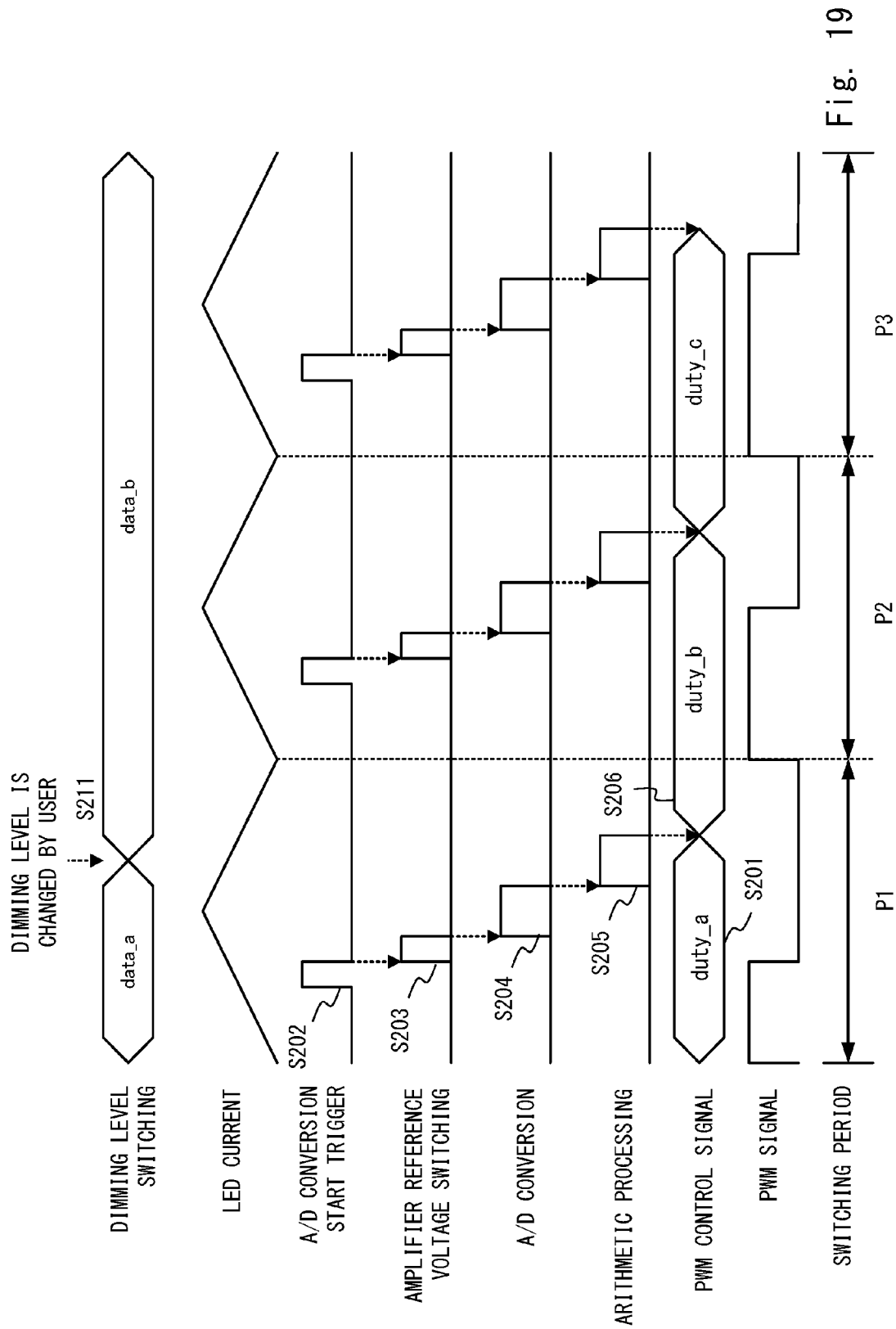
FIG. 19 is a timing diagram showing an operation example of a power supply device according to the third embodiment.

FIG. 19 is a timing diagram showing an example of the LED dimming operation of the third embodiment. As shown in FIG. 19, when the dimming level is changed by a user (S211), the determination area is selected according to the dimming level and the amplifier reference voltage is set as shown in the flowchart of FIG. 18. When the amplifier reference voltage is set and the A/D conversion is performed, the arithmetic processing unit 103 generates the PWM control signal having a duty ratio that matches the set dimming level. This allows the LEDs 30 to emit light at the dimming level set by the user.

As described above, in the third embodiment, as the determination area for determining the detected voltage according to the dimming level is set, the amplifier reference voltage can be set at a higher speed.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer through a wired communication line, such as electric wires and optical fibers, or a wireless communication line.

The invention made by the present inventors has been described above with reference to embodiments. However, the present invention is not limited to the above embodiments, and various modifications can be made without departing from the scope of the invention.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
   an input voltage detection unit configured to detect an analog input voltage;
   a reference voltage setting unit configured to set a reference voltage based on the detected input voltage;
   a difference amplifier configured to amplify a difference between the input voltage and the reference voltage;
   an A/D converter configured to perform an A/D conversion of the amplified signal; and
   an arithmetic processing unit configured to calculate a digital voltage corresponding to the input voltage based on a result of the A/D conversion and the reference voltage,
   wherein the input voltage detection unit comprises a comparator configured to compare a threshold voltage with the input voltage, and
   the reference voltage setting unit sets the threshold voltage so that the comparator detects the input voltage.

2. The semiconductor device according to claim 1, wherein the reference voltage setting unit sets, to the reference voltage, the threshold voltage used when the comparator detects the input voltage.

3. The semiconductor device according to claim 1, wherein the reference voltage setting unit sequentially selects one divided range from divided ranges obtained by dividing an input range of the A/D converter, and sets the threshold voltage based on the selected divided range.

4. The semiconductor device according to claim 3, wherein the divided range is a range obtained by dividing the input range of the A/D convener by a gain of the difference amplifier.

5. The semiconductor device according to claim 1, wherein the reference voltage setting unit sets the reference voltage based on the divided range corresponding to the input voltage among the divided ranges obtained by dividing the input range of the A/D converter.

6. The semiconductor device according to claim 5, wherein the divided range is a range obtained by dividing the input range of the A/D converter by a gain of the difference amplifier.

7. The semiconductor device according to claim 1, further comprising a variable voltage source configured to generate the reference voltage and supply the generated reference voltage to the difference amplifier, wherein the reference voltage setting unit sets the reference voltage generated by the variable voltage source.

8. The semiconductor device according to claim 7, wherein the variable voltage source is a DA converter configured to perform a DA conversion of a setting signal supplied from the reference voltage setting unit.

9. The semiconductor device according to claim 1, wherein the reference voltage setting unit sets the reference voltage generated by a variable voltage source connected to the semiconductor device.

10. The semiconductor device according to claim 9, wherein the variable voltage source is a variable resistor having a variable resistance value depending on the setting signal supplied from the reference voltage setting unit.

11. The semiconductor device according to claim 1, wherein the arithmetic processing unit obtains the digital voltage by adding the reference voltage to the result of the A/D conversion.

12. A power supply device comprising:
a power supply unit configured to generate power according to a control signal; and
a semiconductor device configured to generate the control signal based on the generated power,
wherein the semiconductor device comprises:
an input voltage detection unit configured to compare a threshold voltage with the generated power as an input voltage by a comparator to detect the input voltage;
a reference voltage setting unit configured to set a reference voltage based on the detected input voltage and set the threshold voltage so that the comparator detects the input voltage;
a difference amplifier configured to amplify a difference between the input voltage and the reference voltage;
an A/D converter configured to perform an A/D conversion of the amplified signal;
an arithmetic processing unit configured to calculate a digital voltage corresponding to the input voltage based on a result of the A/D conversion and the reference voltage; and
a control signal generation unit configured to generate the control signal based on the digital voltage.

13. A control method for a semiconductor device comprising an A/D converter, the control method comprising:
comparing threshold voltage with an analog input voltage by a comparator to detect the input voltage;
setting a reference voltage based on the detected input voltage;
setting the threshold voltage so that the comparator detects the input voltage;
amplifying a difference between the detected input voltage and the set reference voltage;
performing, by the A/D converter, an A/D conversion of the amplified signal; and
calculating a digital voltage corresponding to the input voltage based on a result of the A/D conversion and the reference voltage.

* * * * *